(12) United States Patent
Own

(10) Patent No.: US 12,397,313 B1
(45) Date of Patent: Aug. 26, 2025

(54) COATING OF SAMPLES FOR MICROSCOPY

(71) Applicant: Mochii, Inc., Seattle, WA (US)

(72) Inventor: Christopher Su-Yan Own, Seattle, WA (US)

(73) Assignee: Mochii, Inc., Seattle, WA (US)

( * ) Notice: Subject to any disclaimer, the term of this patent is extended or adjusted under 35 U.S.C. 154(b) by 0 days.

(21) Appl. No.: 18/217,630

(22) Filed: Jul. 3, 2023

Related U.S. Application Data

(62) Division of application No. 16/702,474, filed on Dec. 3, 2019, now Pat. No. 11,850,620.

(60) Provisional application No. 62/774,851, filed on Dec. 3, 2018.

(51) Int. Cl.
| | | |
|---|---|---|
| B05C 1/00 | (2006.01) | |
| B01L 1/00 | (2006.01) | |
| B05C 5/00 | (2006.01) | |
| B05C 15/00 | (2006.01) | |

(52) U.S. Cl.
CPC ............... B05C 1/003 (2013.01); B01L 1/00 (2013.01); B05C 5/001 (2013.01); B05C 15/00 (2013.01)

(58) Field of Classification Search
None
See application file for complete search history.

(56) References Cited

U.S. PATENT DOCUMENTS

| | | | | |
|---|---|---|---|---|
| 3,738,314 A * | 6/1973 | Morelock | ............... | C03C 25/42 118/733 |
| 5,037,611 A * | 8/1991 | Ledford, Jr. | ........... | G01N 30/16 436/171 |
| 6,586,171 B1 * | 7/2003 | Iwado | ..................... | F26B 21/06 430/935 |
| 6,656,017 B2 * | 12/2003 | Jackson | ............ | H01L 21/67051 451/39 |
| 6,787,229 B1 * | 9/2004 | Muradov | ............... | B82Y 30/00 428/408 |
| 7,501,145 B2 * | 3/2009 | Selvamanickam | ......................... | H10N 60/0521 427/596 |
| 8,585,826 B2 * | 11/2013 | Schreiber | .................. | B08B 1/32 15/309.1 |
| 8,628,620 B2 * | 1/2014 | Kawato | .................. | H10K 71/16 118/504 |
| 8,717,395 B2 * | 5/2014 | Marcus | ..................... | B41J 2/105 347/112 |
| 8,852,687 B2 * | 10/2014 | Chang | .................... | C23C 14/042 427/294 |
| 9,580,791 B2 * | 2/2017 | Inoue | ........................ | C23F 1/02 |
| 9,815,697 B2 * | 11/2017 | Lemaire | ................ | C01B 32/162 |
| 9,957,617 B2 * | 5/2018 | Kuh | ........................ | C23C 16/481 |

(Continued)

*Primary Examiner* — Jethro M. Pence
(74) *Attorney, Agent, or Firm* — Nienstadt PLLC

(57) ABSTRACT

A coater is provided for depositing a coating onto a sequence of samples to be analyzed in a microscope. The coater includes a process chamber to maintain a low-pressure vacuum or controlled gaseous environment at a deposition region inside the process chamber, a sample conveyor to support and convey samples through the deposition region, an evaporant supply to vaporize material from an evaporant source onto the samples at the deposition region, and a controller to control one or more operations of the coater. The sample conveyor is adapted to convey the samples in discrete movements and/or the coater is adapted to provide one or more discrete pulses of power to the evaporant supply.

20 Claims, 10 Drawing Sheets

(56) References Cited

U.S. PATENT DOCUMENTS

| | | | |
|---|---|---|---|
| 11,732,345 B2* | 8/2023 | Bangert | C23C 14/54 |
| | | | 427/250 |
| 11,837,709 B2* | 12/2023 | Moon | H01M 4/139 |
| 2004/0231186 A1* | 11/2004 | Kolb | B05C 15/00 |
| | | | 34/500 |
| 2005/0092253 A1* | 5/2005 | Selvamanickam | C23C 14/087 |
| | | | 118/723 EB |
| 2012/0304924 A1* | 12/2012 | Fernholz | B05B 13/0221 |
| | | | 118/500 |
| 2013/0273746 A1* | 10/2013 | Kawato | H01L 21/67017 |
| | | | 438/758 |
| 2015/0020954 A1* | 1/2015 | Lemaire | B29C 65/7897 |
| | | | 156/158 |
| 2016/0014906 A1* | 1/2016 | Ilic | H05K 3/12 |
| | | | 427/98.4 |
| 2017/0200913 A1* | 7/2017 | Yoshida | B32B 37/14 |
| 2018/0309136 A1* | 10/2018 | Vieluf | H01M 4/8825 |
| 2019/0252182 A1* | 8/2019 | Kadono | C23C 16/26 |

\* cited by examiner

Fig. 9

COATING OF SAMPLES FOR MICROSCOPY

CLAIM FOR PRIORITY

This application is a divisional of U.S. patent application Ser. No. 16/702,474, filed Dec. 3, 2019, which claims priority under 35 U.S.C. § 119 (e) to Provisional Application No. 62/774,851, filed Dec. 3, 2018, all of which are incorporated herein by reference in their entireties.

TECHNICAL FIELD

This application relates to coating samples for microscopy, such as charged-particle-beam microscopy.

BACKGROUND

Microscopy of a sample, such as charged-particle-beam microscopy, may require or may be improved by applying a predetermined coating onto the sample. For example, in certain types of charged-particle-beam microscopy, such as scanning electron microscopy (SEM) and scanning transmission electron microscopy (STEM), a conductive or semiconductive coating may be applied to the surface of a substantially nonconductive sample to allow or improve the quality of imaging. The coating material may include, for example, carbon or a metal such as gold or platinum, and may be deposited onto the sample by vapor deposition, such as sputter coating. The coating material can inhibit charge buildup on the sample, can reduce damage to the sample by a charged-particle-beam, and can improve secondary electron emission.

Microscopy is used to sequentially image a set of samples, such as a set of related or similar biological samples. For example, an ordered set of biological samples may be contained on a tape reel that is supplied to a microscope such that the samples can be imaged sequentially. However, conventional coating processes are typically not designed such that they can be performed rapidly, reliably, consistently, and without constant intervention by a human operator on each of such a sequence of samples.

For example, a conventional coating process may require a single sample to be placed in a coating deposition chamber, the chamber to be pumped down to low pressure, a deposition of the coating onto the sample to be performed, the chamber to be returned to ambient pressure, the sample to be removed and inspected, and this process to be repeated for each sample. This process is typically inefficient and slow and requires substantial time expenditure by a skilled human operator. Further, the conventional coating process may not be capable of coating the samples after they are already contained on a tape reel.

Thus, it is desirable to provide apparatuses and methods for depositing a coating onto a sequence of samples. It is also desirable for the coating of the sequence of samples to be substantially reliable, rapid, and easy to perform without extensive training. It is further desirable to deposit a coating onto a sequence of samples that are contained on a tape reel.

SUMMARY

In one embodiment, a coater is provided for depositing a coating onto a sequence of samples to be analyzed in a microscope. The coater comprises a process chamber to maintain a low-pressure vacuum or controlled gaseous environment at a deposition region inside the process chamber. The coater further comprises a sample conveyor to support and convey samples through the deposition region. An evaporant supply is provided to vaporize material from an evaporant source onto the samples at the deposition region. The coater also comprises a controller to control one or more operations of the coater. The sample conveyor is adapted to convey the samples in discrete movements and/or the coater is adapted to provide one or more discrete pulses of power to the evaporant supply.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several embodiments and aspects of the transmission electron microscopes described herein and, together with the description, serve to explain the principles of the invention.

FIG. 9 is a partial screen capture of an example of an embodiment of a user interface (UI) that is provided to a human operator.

DETAILED DESCRIPTION

Figure 1:
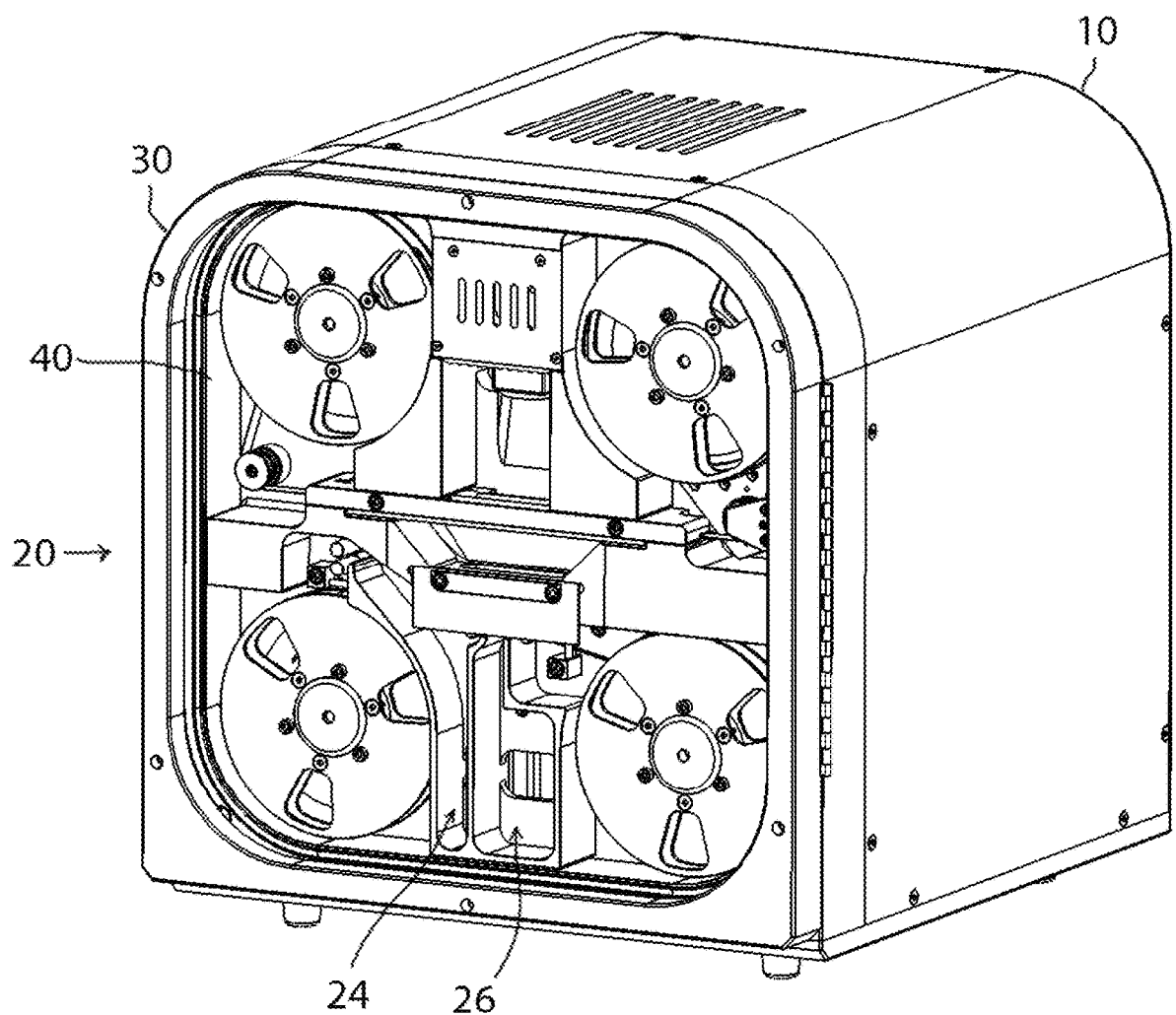
FIG. 1 is a three-dimensional perspective view of an example of an embodiment of a coater.

Microscopes are commonly used to image and otherwise analyze samples. For example, charged-particle-beam microscopes—such as a transmission electron microscope (TEM), scanning electron microscope (SEM), scanning transmission electron microscope (STEM), or focused ion beam (FIB) microscope—may be adapted to image or otherwise analyze samples at high resolution. A charged-particle-beam microscope typically illuminates the sample with one or more charged-particle beams (such as electron beams) and detects radiation from the sample to generate an image of the sample. A TEM, for example, converges an electron beam into a "field of view" on the sample to image that field. A SEM or STEM, meanwhile, scans an electron beam that is formed into a probe across the sample to generate an image pixel-by-pixel. The images may be evaluated, such as by a human operator of the microscope or automatically, to identify characteristics of the sample.

A flexible tape may be provided as a carrier medium for multiple samples to be stored and analyzed in a microscope in sequence. The samples may be created in a different preparation step and placed onto the flexible tape for analysis. A tape system may be provided for the charged-particle-beam microscope to transport the flexible tape across the viewing area of the microscope. For example, the viewing area may be a small aperture in a cartridge that holds the tape such that a sample can be analyzed and the tape can be advanced to analyze subsequent samples.

Various examples of charged-particle-beam microscopes and tape systems are described in U.S. patent application Ser. No. 15/339,922 to Own et al., filed Oct. 31, 2016, and titled "Improvements in Transmission Electron Microscopy," and U.S. Pat. No. 9,997,331 et al., issued Jun. 12, 2018, and titled "Charged-Particle Beam Microscopy," which are incorporated herein by reference in their entireties.

The tape system may advance or reverse the tape by frictional contact with a driven part, such as a reel, pulley, or other wheel. In another version, however, the tape has sprocket holes along one or both edges and the tape system has a sprocket drive to drive the tape.

The tape may be made of a flexible continuous material with suitable thermal isolation and damping properties. Examples of materials that may be suitable for use in the vacuum environment of the charged-particle-beam microscope include, for example, polyimide, neoprene, and Viton®. The tape may be coated with a conductive or moderately resistive film or impregnated with conductive particles to ensure electrical conductivity and to carry away excess charge.

The tape may have a plurality of holes or electron-transparent windows, such as at discrete regular distances. An electron-transparent window may be made of, for example, an oxide or thin carbon film. A sample may be suspended over an aperture or electron-transparent window for imaging. Thus, the samples may be placed at discrete regular distances on the tape that coincide with the holes or electron-transparent windows.

In another embodiment, the tape supports discrete sample carriers on which samples are placed. The discrete sample carrier may be, for example, a semiconductor chip or metal foil that supports and/or encapsulates a sample. The discrete sample carrier may be embedded in the tape before the sample is loaded. Alternatively, the discrete sample carriers may be prepared with samples thereon before they are inserted into the tape.

A discrete sample carrier may carry one or more samples. For example, in one embodiment, a discrete sample carrier has a single aperture with a larger single rigid sample placed thereon. In another embodiment, a discrete sample carrier has a single large aperture with multiple samples, such as linear polymer strands, laid over it. In still another embodiment, the discrete sample carrier has a plurality of apertures therein, which may be shaped and sized differently, for supporting a plurality of samples laid over the distinct apertures.

Furthermore, the samples may be identified and tracked. If the samples are fed into the microscope by flexible tape, for example, an identification (ID) code may be placed on the tape adjacent to, or otherwise in a predefined location relative to, the samples to uniquely identify the samples. The ID code may be, for example, a visual pattern, QR code, or barcode.

A coater 10 may be provided to deposit a coating onto each of multiple samples that are sequentially conveyed. The coating may be adapted to protect the sample and/or reduce beam-induced charging at the sample. The coating may be shaped as a thin layer and comprise electron transparent and electrically conductive material. In one example, the material comprises amorphous carbon. FIG. 1 is a three-dimensional perspective view of an example of an embodiment of a coater, for the sake of illustration.

Coater 10 has a process chamber 20 to enclose a process space in which a material is evaporated from a source and deposited on the samples. A pump may be provided to pump down the processing space of process chamber 20. For example, the pump may pump down process chamber 20 to a pressure of less than about $10^{-2}$ Torr, or preferably less than about $10^{-3}$ Torr. Process chamber 20 may have one or more pumping orifices through which the pump evacuates process chamber 20. For example, process chamber 20 may have a preheating stage pumping orifice 24 and a channel running from orifice 24 to a source preheating stage to evacuate an area near the source preheating stage. Process chamber 20 may also have an evaporant pumping orifice 26 and a channel running from orifice 26 to a main heating stage to evacuate an area near the main heating stage, which is where the coating material is vaporized from the source (e.g., filament). A vent valve may also be provided for purging process chamber 20 with inert or activated gas.

Figure 2:
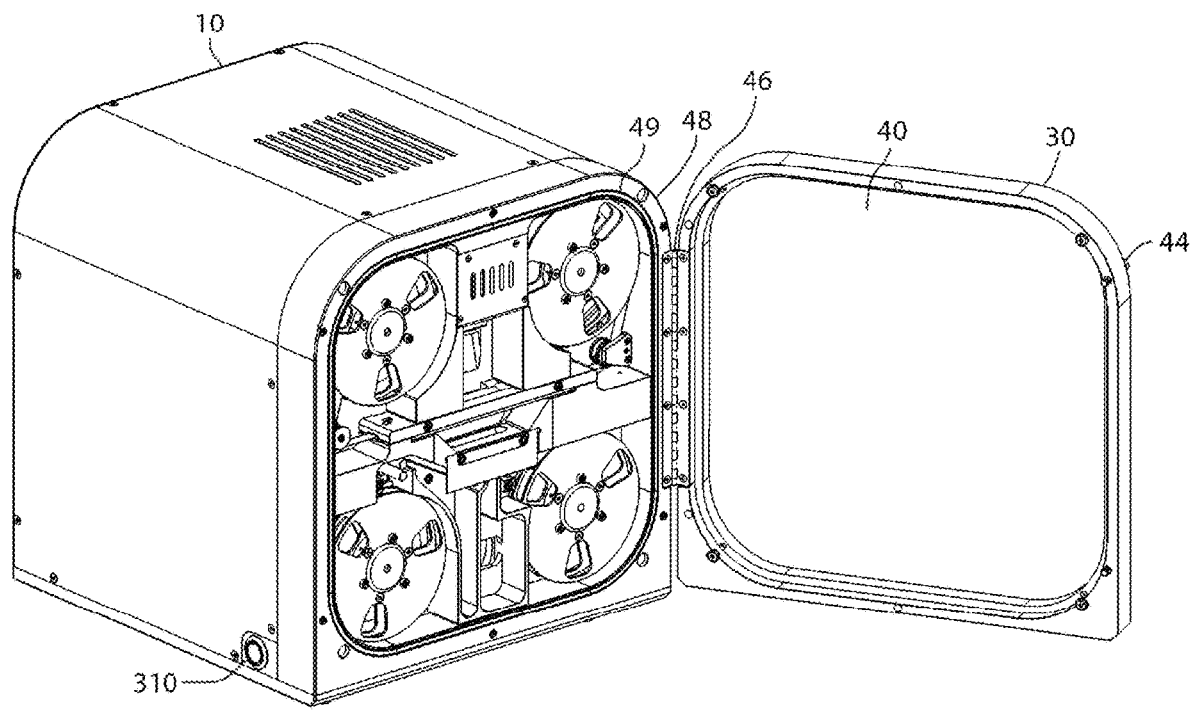
FIG. 2 is a three-dimensional perspective view of the coater of FIG. 1 with the door open.

Coater 10 may have a door 30 to access the process space within process chamber 20. For example, FIG. 2 is a three-dimensional perspective view of the coater of FIG. 1 with door 30 open. Coater 10 may also comprise a visually transparent window 40, allowing an operator to view the coating process in real time. In one version, such as the example shown in FIG. 2, substantially visually transparent window 40 is embedded in door 30. Door 30 may also have a handle 44 for manually opening and closing the door and a hinge 46 to attach door 30 to an opening of process chamber 20. Door 30 may close onto a frame 48 of process chamber 20, which may include a seal 49 to preserve the vacuum or gaseous environment inside process chamber 20.

Figure 3:
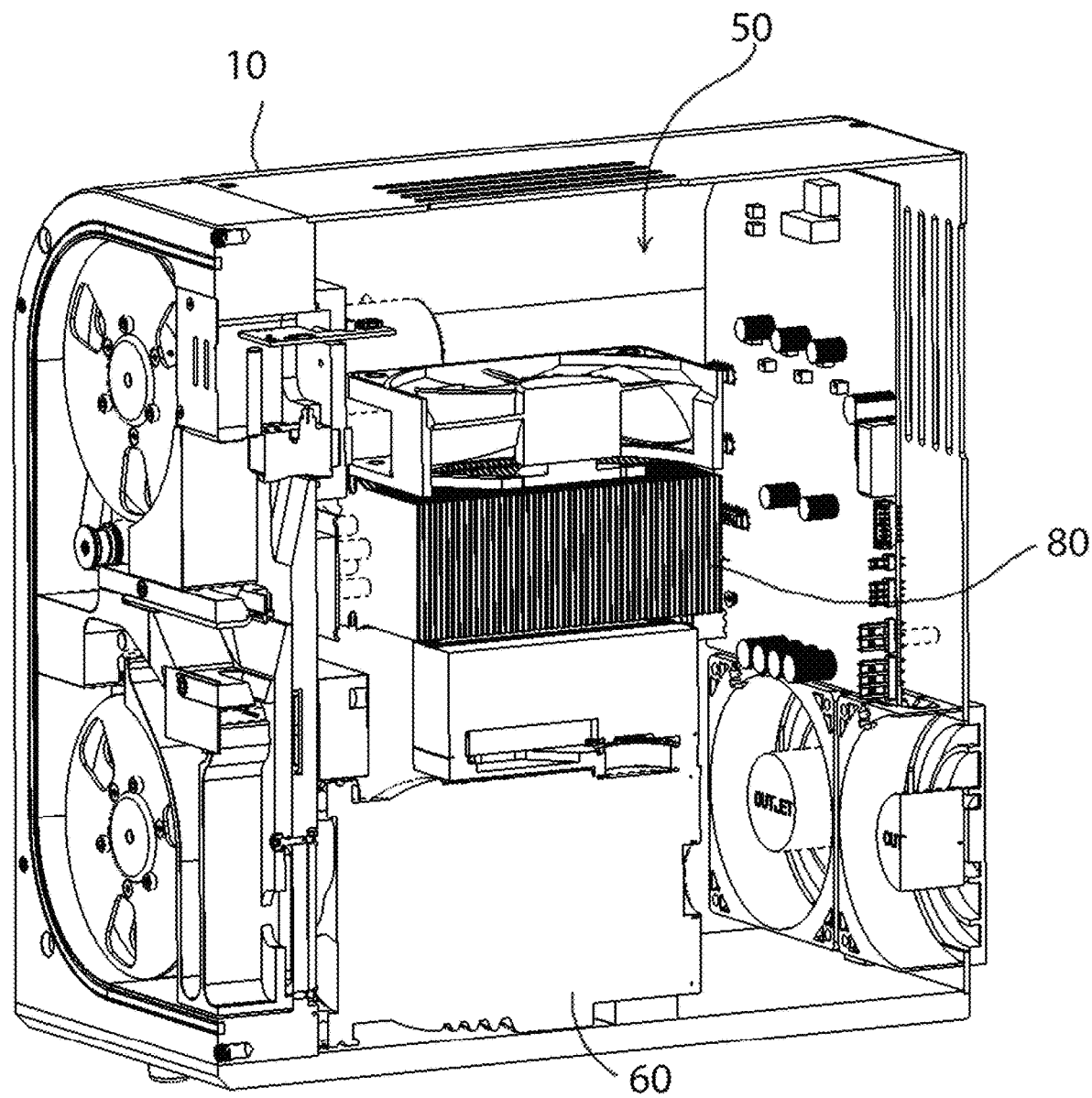
FIG. 3 is a three-dimensional perspective cut-away view of the coater of FIG. 1.

For example, door 30 may form a wall at the entire front side or most of the front side of process chamber 20, with the transparent window occupying most of the area of door 30, such as shown in the example illustrated in FIG. 3.

Figure 4:
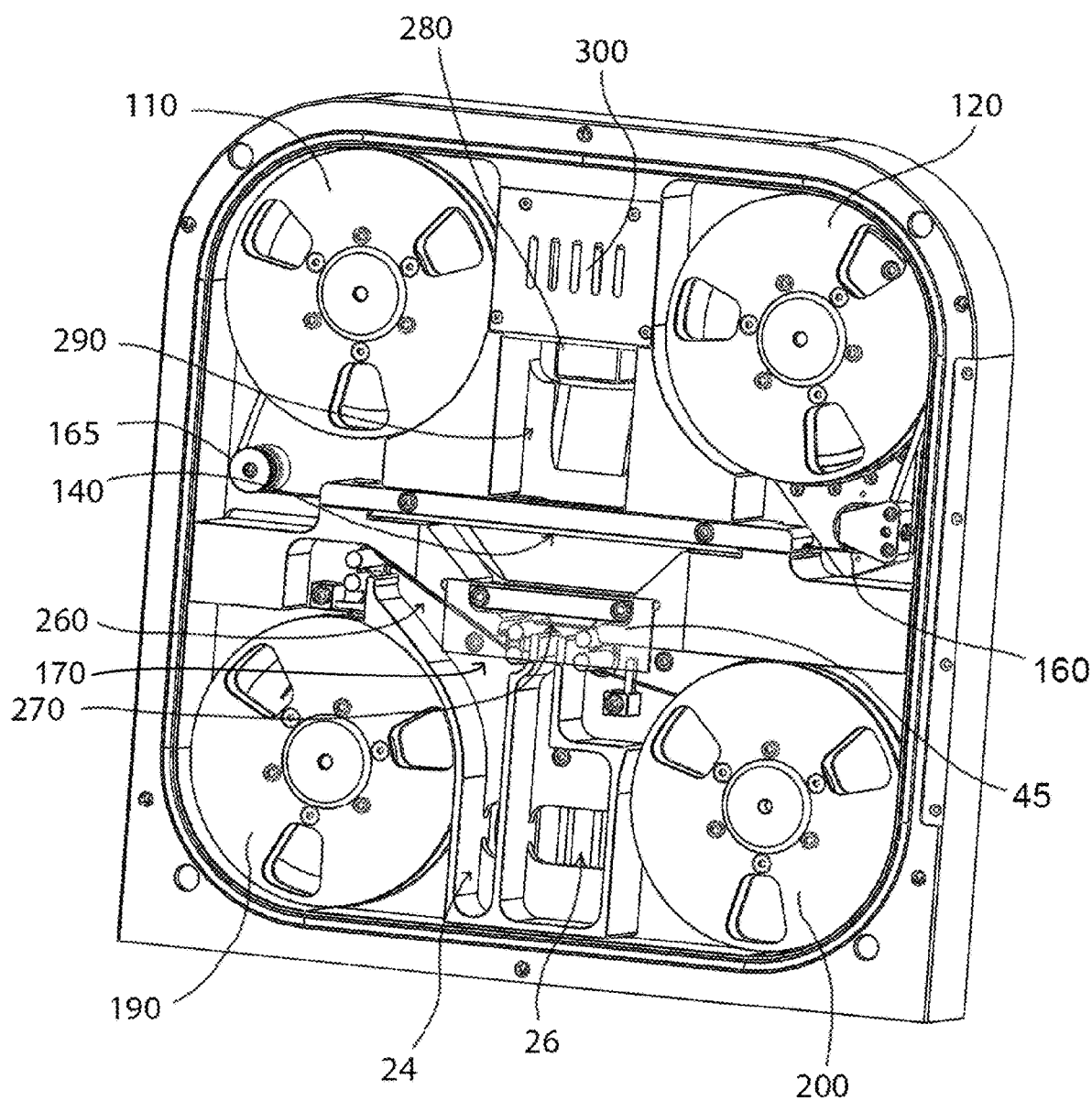
FIG. 4 is a three-dimensional perspective view of the process space of the coater of FIG. 1, with the door removed.

Visually transparent window 40 may be made of a substantially visually transparent material that can withstand the pressure difference between the process space and the external environment. The material may also be selected to be substantially impervious to heat from the evaporation process in process chamber 20. Visually transparent window 40 may comprise, for example, borosilicate glass or quartz. A reflector or removable shield 45 may also be placed in between the process space and the transparent window to protect transparent window 40 from thermal shock and/or help prevent deposition buildup. Shield 45 may be manufactured to be disposable and replaceable after deposition buildup on shield 45. In one embodiment, shield 45 is transparent, such as shown in FIG. 4, although it can become clouded by deposition buildup.

FIG. 3 is a three-dimensional perspective cut-away view of the embodiment of coater 10 illustrated in FIG. 1. Coater 10 may have a component space 50 that is not pumped down and that encloses various components. In the example shown in FIG. 3, component space 50 behind process chamber 20 encloses a pump 60 with a pump controller 70. In this example, a heatsink 80 with a fan 90 may also be provided. Further, coater 10 may have a power supply, such as inside component space 50, to supply electrical power to electronic components of coater 10. The power supply may comprise one or more distinct power supplies, voltage supplies, and/or current supplies.

Coater 10 has a sample conveyor to support and convey samples through the deposition region between deposition processes and/or during a deposition process. In one version, the sample conveyor is a tape drive to control the position of a flexible tape 100, such as discussed above, that holds the samples. FIG. 4 is a three-dimensional perspective view of the process space of the coater of FIG. 1, with door 30 removed.

The tape drive may move tape 130 from a supply (i.e., feed) reel 110 to a takeup (i.e., collection) reel 120. During operation, tape 130 is provided by supply reel 110, is advanced by the tape drive through a deposition zone 140 in which deposition of the coating occurs, and is taken up and stored in takeup reel 120. The tape drive may move tape 130 discretely or continuously, or in a combination of discrete and continuous movements. Further, the tape drive may move tape 130 not only from supply reel 110 to takeup reel 120, but also rewind tape 130 in the opposite direction.

When not in use, feed reel 110 and/or takeup reel 120 containing tape 130 may be stored at vacuum, or, alternatively, at atmosphere or in a specialized gas. For example, reels 110, 120 may be maintained in specialized containers kept at low pressure.

The tape drive may also have one or more pulleys, such as a drive pulley and a free pulley, to control tape 130. For example, in the embodiment shown in FIG. 4, pulley 150 is a free (i.e., undriven) pulley and pulley 160 is a drive (i.e., driven) pulley. Drive pulley 160 may be driven by a torque to pull tape 130, such as, for example, by friction contact or by sprocket drive. Drive pulley 160 may be used to precisely position the samples, which may or may not be indexed with unique identifiers and/or separators that can be used to detect the positions of the samples within deposition zone 140. In one example, drive pulley 160 pulls tape 130 with a tension on the order of one kilogram.

One or both of reels 110, 120 may be driven directly, such as by motors positioned inside component space 50 and coupled to reels 110, 120. For example, reels 110, 120 may apply passive tension to the tape, such as on the order of ten or a hundred grams. For example, one or more DC motors may apply a small torque to one or each of both of reels 110, 120 (in FIG. 4, clockwise torque to reel 110 and counterclockwise torque to reel 120) to tension tape 130 between them. (Alternatively, stepper motors may be adapted to be used instead of DC motors.) In one example, tape 130 is tensioned at from about 10 g to about 200 g between reel 110 and reel 120. Drive pulley 160 may apply a force to tape 130 that helps overcome the torque of takeup reel 120 to draw tape 130 out of supply reel 110. One or both of reels 110, 120 may also be driven to advance or rewind tape 130 to a desired position. The torques applied to reels 110, 120 and drive pulley 160 may be preselected to not exceed certain values to prevent breaking or damage to tape 130 and/or the samples thereon.

The tape drive may also have one or more tension meters to measure the tension of tape 130 at one or more predetermined locations of concern. The tape drive may use the measured tension in tape 130 to control the relative speed of the two drives to keep the tape tension constant or to prevent damage to delicate films or samples carried on tape 130 by keeping the tension under a critical value. The tension meter may also detect any slippages, breaks of the tape, or motor malfunctions of the tape drive.

The tape drive may additionally use one or more controllable clamps, such as for stabilizing, cooling, and/or electrically grounding tape 130. A clamping force limiter can be provided to prevent overtensioning of tape 130.

Coater 10 may optionally have an identification (ID) code reader 165 (not visible) to read an identifying code on tape 130, such as a barcode or other computer-readable code.

Coater 10 has an evaporant supply 170 that vaporizes material from an evaporant source onto the samples. In one example, the evaporant source comprises a filament 180, such as, for example, a carbon filament, carbon-fiber braid, or carbon ribbon. In other examples, filament 180 may be a metal filament or flexible wire comprising, for example, gold, silver, or tungsten.

In one example, the evaporant source, such as filament 180, may be positioned at a distance from the sample of from about 5 mm to about 25 cm. This distance may be adjusted to achieve a desirable rate of deposition while preventing overheating of the sample being coated.

Coater 10 may also comprise a filament drive to control the advancement of the evaporant source where the evaporant source is filament 180. The filament drive may comprise a filament supply reel 190 and a filament takeup reel 200, and may move filament 180 from supply reel 190 to takeup reel 200. The filament drive may move filament 180 discretely or continuously, or in a combination of discrete and continuous movements. The filament drive may have one or more motors to drive the one or more driven reels and/or pulleys. These motors may include, for example, precision stepper motors or DC motors. The filament drive may have one or more tension meters to measure the tension of filament 180 at one or more predetermined locations of potential concern.

In one version, the filament drive may operate without pulleys. However, the filament drive may have one or more filament guides 210, 220. Filament guides 210, 220 may be made, for example, of beryllium copper or a refractory material, such as, for example, tungsten carbide. Filament guides 210, 220 may be fixed to the inside of process chamber 20 by, for example, insulating mounts 215, 225, respectively. In one example, shown in FIG. 4, one filament guide 210 is positioned near filament supply reel 190, and another filament guide 220 is positioned near filament takeup reel 200, to restrain lateral movement of filament 180.

In one version, the filament drive tensions filament 180 between filament supply reel 190 and filament takeup reel 200 during evaporation. For example, one or more DC motors may apply a small torque to each of one or both of reels 190, 200 to gently tension filament 180 between them. (Alternatively, stepper motors may be adapted to be used instead of DC motors.) In one example, the filament drive provides a tension to filament 180 of from about 10 g to about 200 g.

The filament drive may be adapted to tension and advance filament 180 while substantially preventing fraying of filament 180. For example, advancing filament 180 by detensioning filament 180 on the supply side (i.e., after filament supply reel 190) rather than by increasing the torque of filament takeup reel 200, can reduce overall stress along filament 180 and thereby help prevent fraying of filament 180.

In one embodiment, to advance filament 180 to provide a new (unused) length of filament 180 in main heating stage 270, filament supply reel 190 is rotated without a corresponding rotation of filament takeup reel 200 to provide a preselected length of slack (i.e., detensioned) filament 180 between them. Filament takeup reel 200 may be driven with a constant torque (e.g., with a clockwise torque), which then takes up the preselected length of slack filament 180 to advance an unused length of filament 180 into main heating stage 270. Afterward, the entire length of slack filament 180 returns to a state of being gently tensioned.

Coater 10 may have two or more heater electrodes 230, 240, 250 to guide and heat filament 180 as filament 180 is advanced to the deposition region. Heater electrodes 230, 240, 250 may comprise an electrically conductive material and may be shaped and positioned to guide filament 180. For example, each of heater electrodes 230, 240, 250 may include one or more substantially cylindrical metal electrodes over which filament 180 slides or rolls such that the electrode makes an electrical connection at those contact surfaces with filament 180.

In one embodiment, each of heater electrodes 230, 240, 250 includes two cylindrical metal electrodes to increase electrical surface contact between heater electrodes 230, 240, 250 and filament 180. Filament 180 may be wound across or around heater electrodes 230, 240, 250 in one or more ways that provide suitable electrical contact while substantially avoiding fraying or damage to filament 180. For example, filament 180 may be wound around heater electrodes 230, 240, 250 in an "S"-shaped configuration, such as shown in FIG. 4. This configuration may permit substantially secure electrical contact between each of heater electrodes 230, 240, 250 and filament 180. However, any other suitable configuration of wrapping filament 180 around electrode is possible that permits suitable electrical contact between each of heater electrodes 230, 240, 250 and filament 180 while permitting advancement of filament 180 and preventing fraying of filament 180.

Figure 5A:
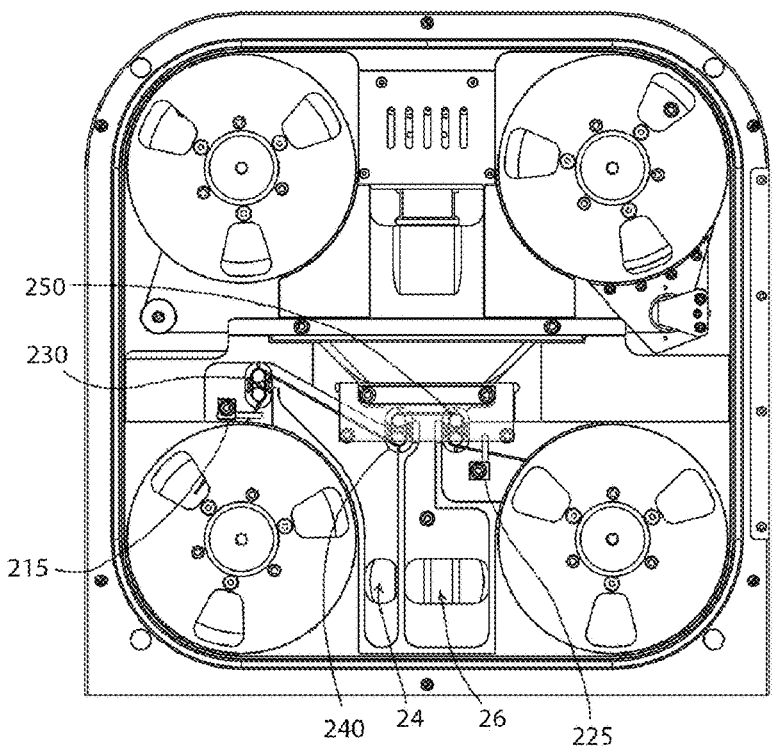
FIG. 5A is a three-dimensional side view of the process space of the coater of FIG. 1, with the door removed.
Figure 5B:
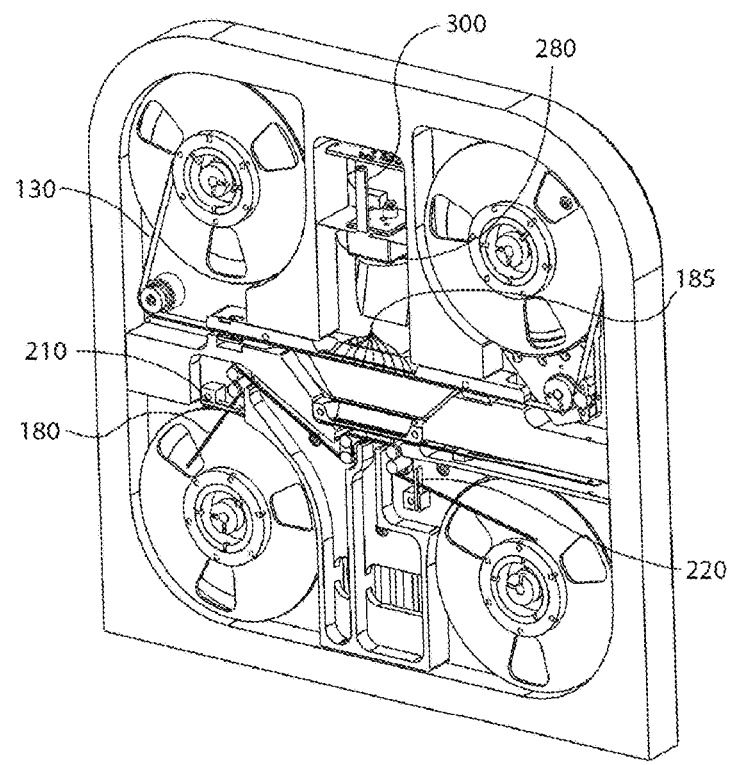
FIG. 5B is a three-dimensional perspective view of the process space of the coater of FIG. 1, with the door and certain covers removed.

FIG. 5A is a three-dimensional side view of the process space of coater 10 of FIG. 1, with door 30 removed. FIG. 5B is a three-dimensional perspective view of the process space of coater 10 of FIG. 1, with the door and certain covers (e.g., shield 45) removed. FIGS. 5A and 5B illustrate different views of the paths of tape 130 and filament 180 in this example. In FIG. 5B, samples 185 are visible through tape 130.

Coater 10 may control the power supply to apply one or more electrical potential differences across two or more heater electrodes 230, 240, 250 to draw current through filament 180 and thereby heat filament 180. By positioning heater electrodes 230, 240, 250 to contact filament 180 at different points, different electrical potentials can be applied at those points of filament 180. Generally, the current drawn through a section of filament 180 will be substantially equal to the voltage difference between the ends of that filament section divided by the electrical resistance of that filament section. Thus, more than two heater electrodes 230, 240, 250 can be configured, and selected electrical potentials applied to them, to differentially heat two or more sections of filament 180 according to the electrical potentials applied at electrodes 230, 240, and 250 and the respective lengths of filament 180 between electrodes 230, 240, and 250.

In one version, coater 10 comprises a preheating stage 260 in which a first heater electrode 230 is set at an (positive or negative) electrical potential difference in relation to second heater electrode 240. Preheating stage 260 may prepare filament 180 by purging filament 180 of impurities without affecting deposition zone 140. In this version, coater 10 also comprises a main heating stage 270 in which a third heater electrode 250 is set at an electrical potential difference in relation to second heater electrode 240.

In one example of this version, substantially the same voltage is applied to first and third heater electrodes 230, 250 in relation to second heater electrode 240. For example, first and third heater electrodes 230, 250 may be held at electrical ground while a positive or negative voltage is applied to second heater electrode 240. In the meantime, first and second heater electrodes 230, 240 may be disposed farther from each other than third and second heater electrodes 250, 240, such that the length of filament 180 in preheating stage 260 is greater, and therefore draws a smaller current and less heat, than the length of filament 180 in main heating stage 270.

In one example, voltage differences applied across electrodes 230, 240, 250 may be from about 40 V to about 80 V, such as about 60V. In this example, each of the filaments may draw a current of from about 1 A to about 20 A, such as about 12 A.

Figure 6:
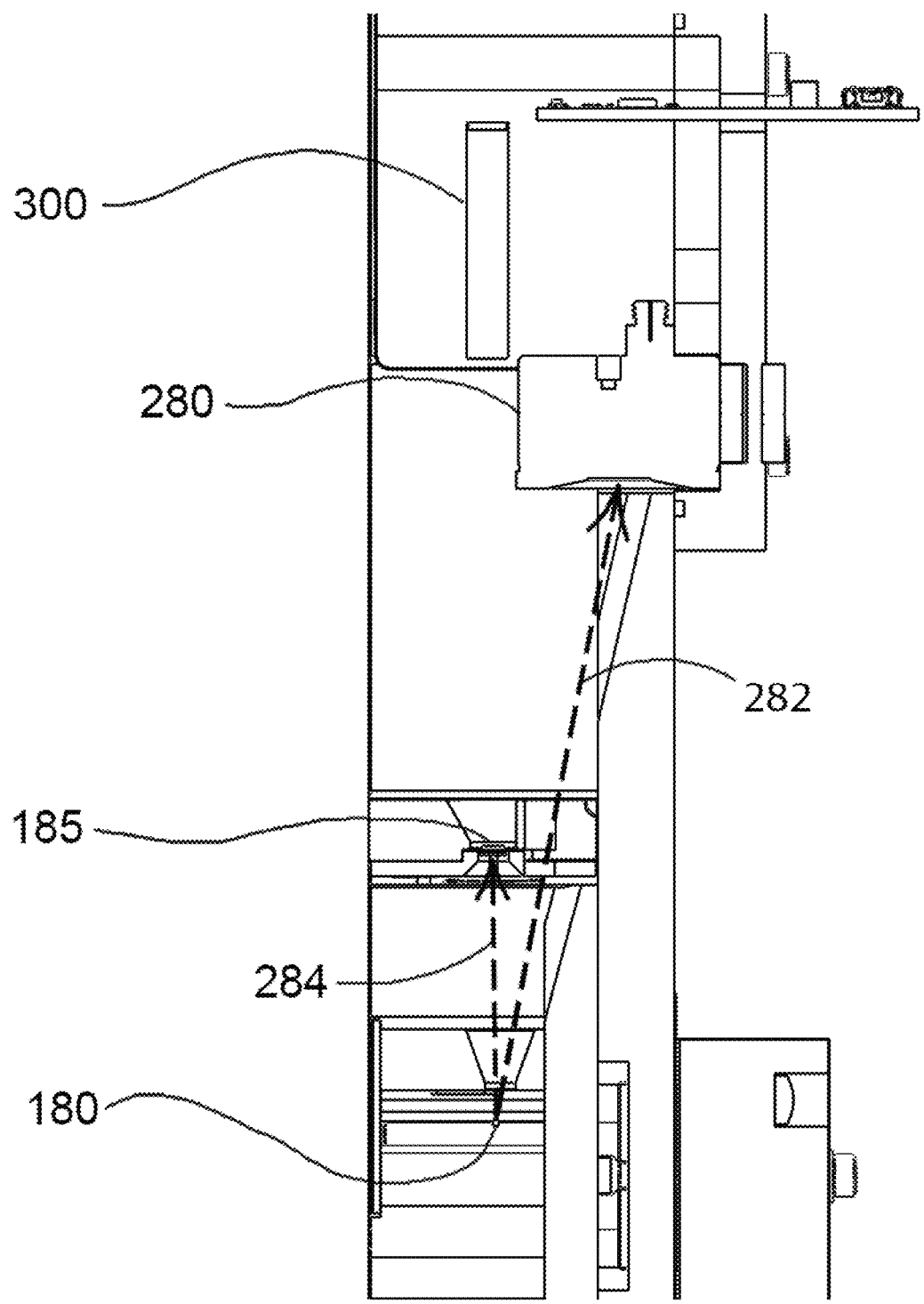
FIG. 6 is a cross-sectional side view of the deposition zone and monitoring zone of the coater of FIG. 1.

Coater 10 may comprise a film-thickness monitor 280 to detect the thickness of the coating. Film-thickness monitor 280 may transmit a signal corresponding to the thickness of the coating during and/or after the deposition process. FIG. 6 is a cross-sectional side view of deposition zone 140 and a film-thickness monitoring zone 290 of coater 10 of FIG. 1. In one example, film-thickness monitor 280 may include a quartz crystal microbalance.

In one version, film-thickness monitor 280 detects a thickness of coating that is deposited on a surface of film-thickness monitor 280 by movement 282 of evaporant across film-thickness monitoring zone 290 and onto a detector surface of film-thickness monitor 280 (e.g., surface of acoustic resonator of a quartz crystal microbalance) simultaneously with movement 284 of evaporant that is being deposited on the sample. Based on a known correlation between the thickness of the sample coating and the thickness of the simultaneous coating on film-thickness monitor 280, coater 10 (such as a controller of coater 10, discussed below) may determine the thickness of the sample coating to a high accuracy.

Film-thickness monitor 280 may be positioned at a distance from the sample (such as on tape 130). For example, film-thickness monitor may be sensitive to heat from evaporant supply 170 and therefore may be positioned at a sufficient distance from evaporant supply 170, such as filament 180, to substantially avoid this effect. Film-thickness monitor 280 may also be offset from the axis of the sample, the evaporant source, and the deposition path to facilitate simultaneous deposition on the sample and film-thickness monitor 280. In one example, film-thickness monitor 280 may be positioned at a distance from the sample of from about 5 cm to about 25 cm.

Coater 10 may additionally have a camera 300 to image the samples, such as before, during, or after the coating process. For example, camera 300 may be adapted to view the integrity of a sample from its back side if that view is not obstructed by a substrate such as a tape or other carrier. In another example, camera 300 may be adapted to view the integrity of the substrate itself.

Coater 10 may be adapted to accurately control the thickness of the coating down to the nanometer scale. Coater 10 may apply evaporant in various embodiments, according to a desired profile of the coating. For example, coater 10 may deposit the coating material in a pulsed or continuous fashion, or in a combination thereof.

In the example illustrated in FIG. 4, the electrical potential at one or both of heater electrodes 240, 250 may be pulsed to generate a pulsed current through length of filament 180 that is in main heating stage 270. For example, solely the voltage at heater electrode 240 may be pulsed. This may cause a pulsed vaporization of the evaporant source.

In one version, coater 10 provides one or more discrete pulses of power to evaporant supply 170 (e.g., current to filament 180) at each of a sequence of discretely advancing positions of the samples to deposit the desired profile of coating. For example, filament 180 may be advanced a discrete amount before each pulse of current. In another example, filament 180 may be advanced a discrete amount before each of a set of three pulses of current.

In another version, coater 10 provides a continuous current to the evaporant supply while advancing the samples in either a discrete or continuous fashion.

In yet another version, coater 10 may have a physical deposition shield that can selectively block or allow deposition through an aperture between evaporant supply 170 and the sample. The deposition shield may be used to control deposition onto the samples instead of, or in addition to, controlling the power applied to evaporant supply 170.

Figure 7:
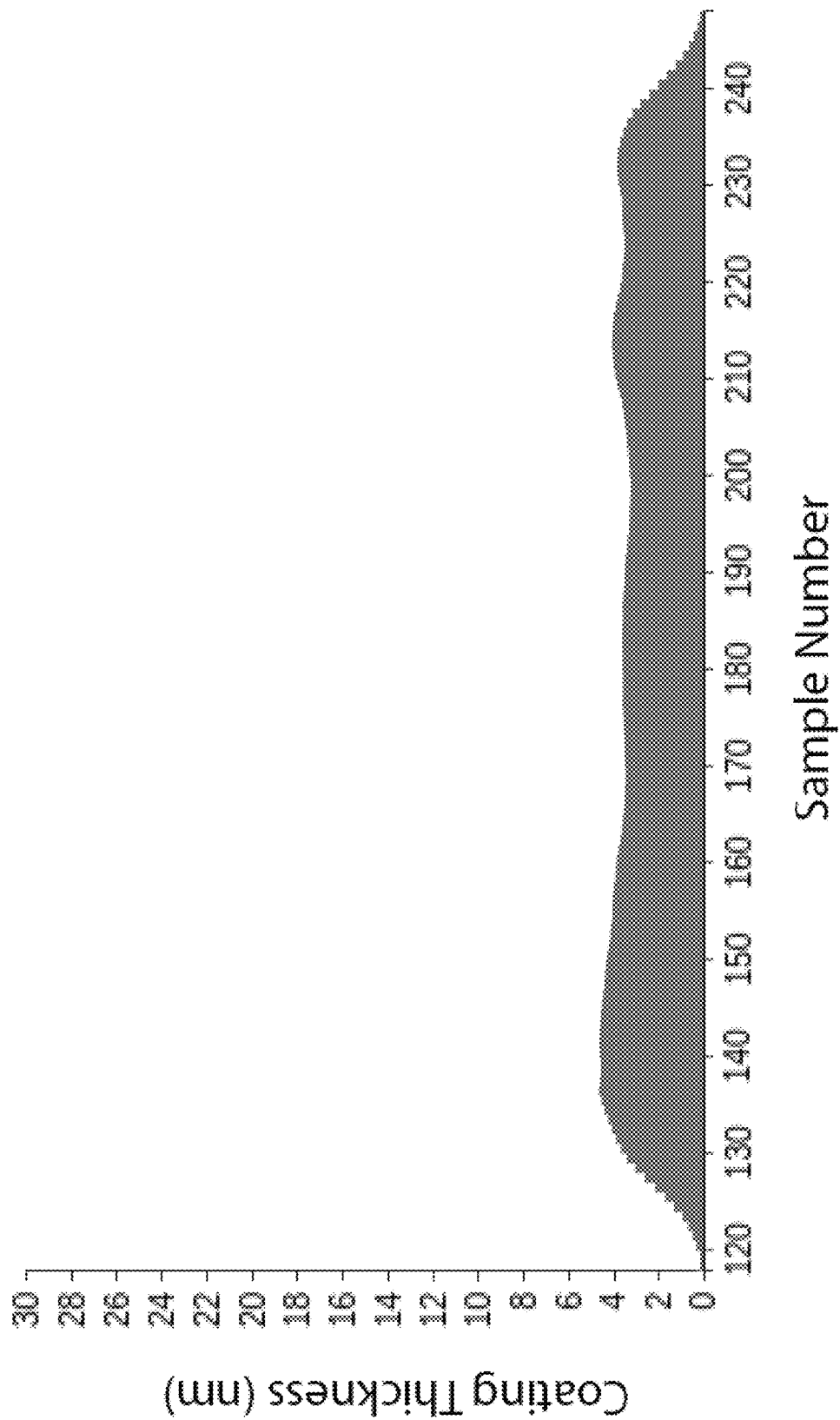
FIG. 7 is a two-dimensional plot of an example of an embodiment of a thickness of a coating as a function of position along a conveyor in terms of sample number.

FIG. 7 is a two-dimensional plot of an example of an embodiment of a thickness of a coating as a function of position along a conveyor in terms of sample number. In this example, coater 10 provided one or more discrete pulses of current to the evaporant supply at each of a sequence of advancing samples to deposit a coating that is substantially uniform across the samples. The evaporation process may be controlled by modulating the process in time or power. For example, the deposition may occur as a sequence of pulses rather than a continuous deposition. By this method, the thickness of the deposition may be controlled and varied for each sample.

Figure 8:
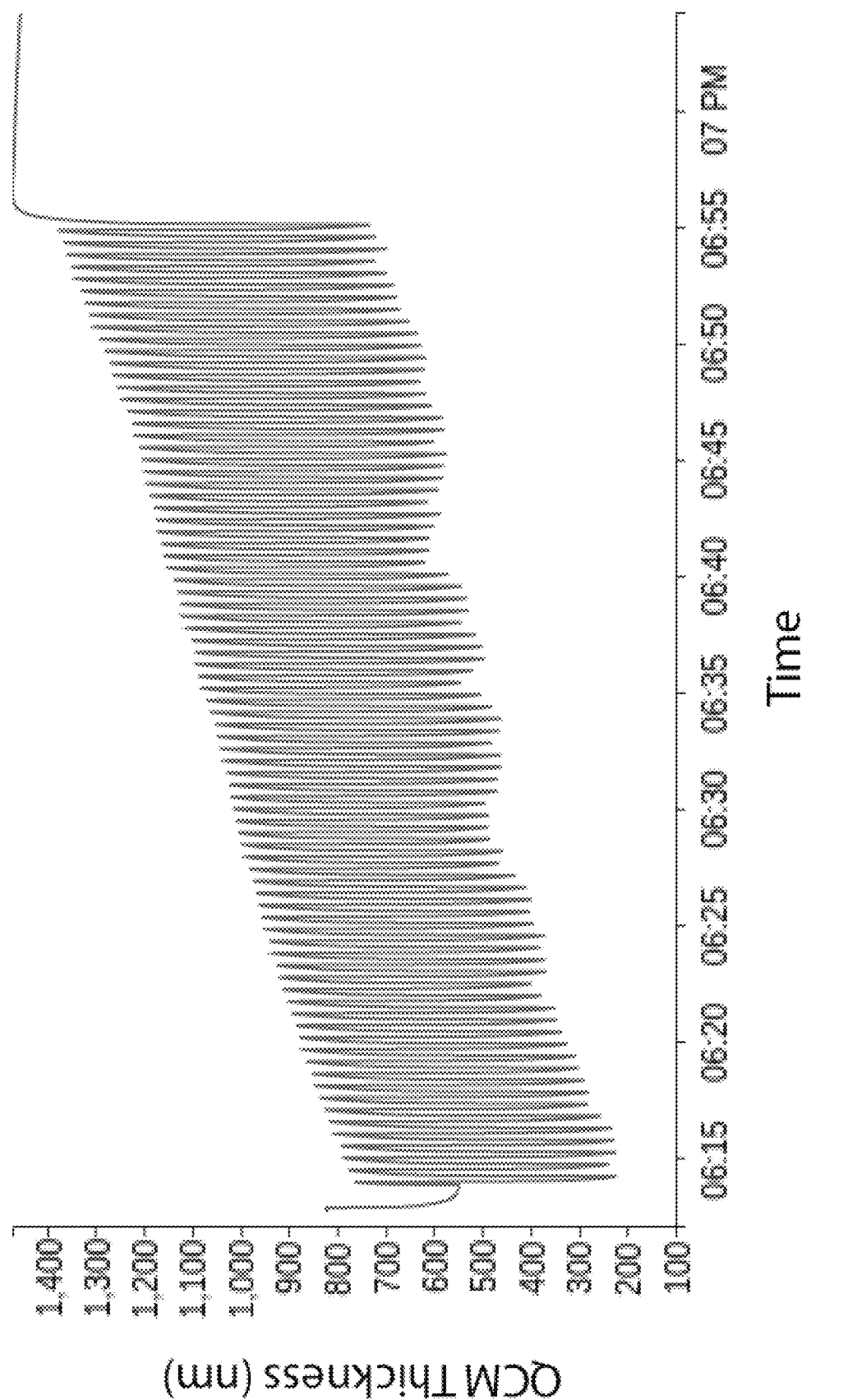
FIG. 8 is a two-dimensional plot of an example of an embodiment of a measurement signal obtained directly from a film-thickness monitor (having a quartz crystal microbalance (QCM)) as a function of time over numerous coating cycles.

FIG. 8 is a two-dimensional plot of an example of an embodiment of a measurement signal obtained directly from a film-thickness monitor 280 (having a quartz crystal microbalance (QCM)) as a function of time over numerous coating cycles. The plot shows a sawtooth pattern, where each "tooth" corresponds to a coating cycle. The plot demonstrates that the measurement signal may have a temperature dependence, which may be interpreted into an accurate calibrated thickness.

Coater 10 may include a controller to control various aspects of operation of coater 10. The controller may, for example, receive inputs from a human user, provide instructions or other signals to components of coater 10, and/or perform data processing of signals detected by coater 10. For example, the controller may control deposition of the coating material, advance, reverse, and/or control the tension of the sample tape, and/or advance or control the tension of the filament. The controller may automatically handle one or more aspects of operation of coater 10, and may even be adapted to substantially automate the operation of coater 10 with minimal input required from a human operator.

The controller may include one or more microprocessors, controllers, processing systems, and/or circuitry, or any suitable combination of hardware and/or software modules. For example, the controller may be implemented in any quantity of personal computers, such as IBM-compatible, Apple, Macintosh, Android, or other computer platforms. The controller may also include any commercially available operating system software, such as Windows, OS/2, Unix, or Linux, and any commercially available and/or custom software such as communications software or microscope monitoring software. Furthermore, the controller may include one or more types of input devices, such as for example a touchpad, keyboard, mouse, microphone, or voice recognition.

The controller software may be stored on a computer-readable medium, such as a magnetic, optical, magneto-optic, or flash medium, floppy diskettes, CD-ROM, DVD, or other memory devices, for use on stand-alone systems or systems connected by a network or other communications medium, and/or may be downloaded, such as in the form of carrier waves, or packets, to systems via a network or other communications medium.

Figure 9:
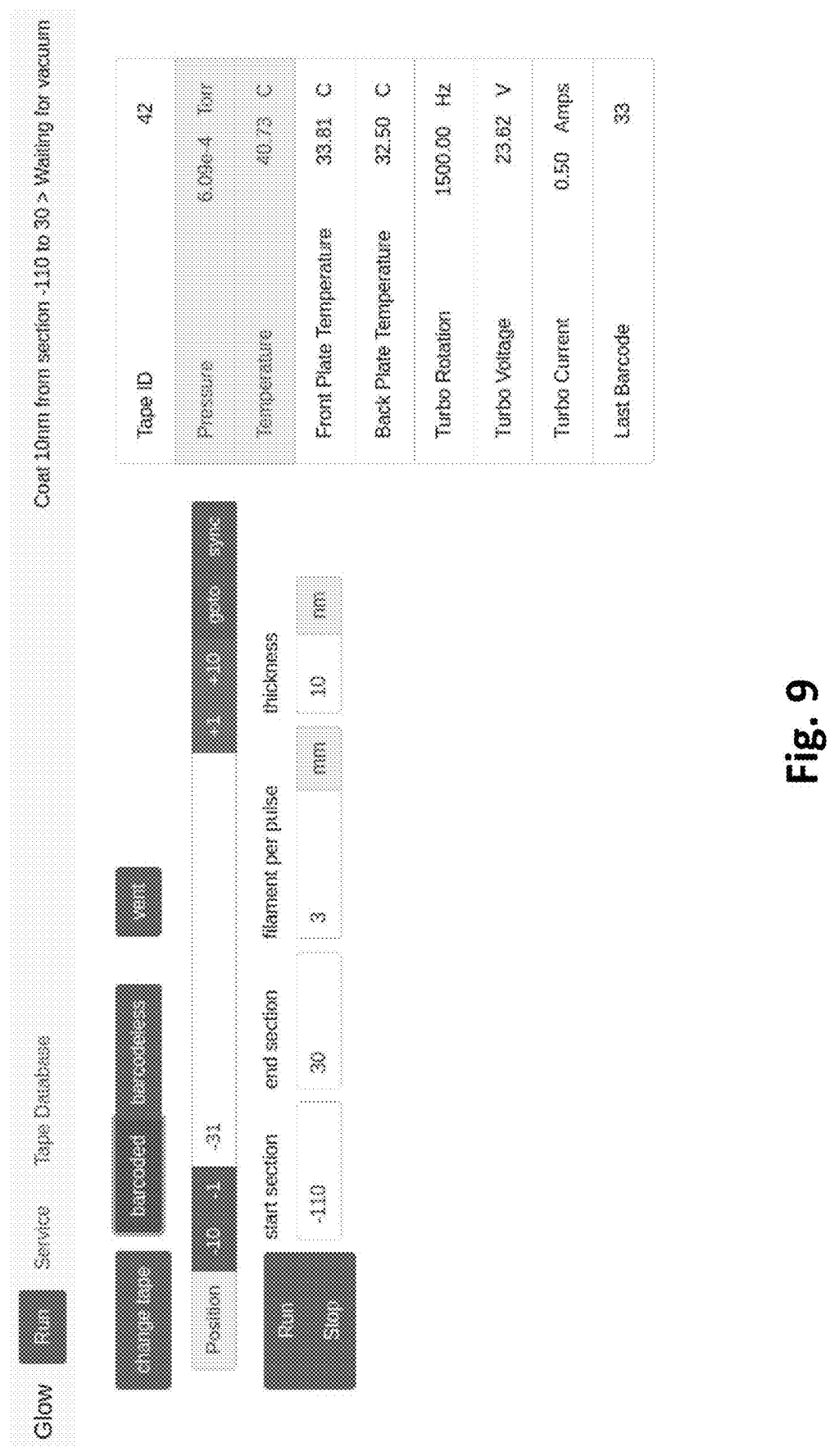

The controller may provide a user interface (UI) to a human operator. FIG. 9 is a partial screen capture of an example of an embodiment of a UI that is provided to a human operator. In this example, the UI permits control of, e.g., current position of tape 130, coating start section, coating end section, advancement of filament 180 per pulse, coating thickness, and pumping down, venting, and/or purging of process chamber 20. The UI may also display parameters of coater 10, such as, for example, process chamber pressure, process chamber temperature, turbopump status, and sample identifiers. The UI may also permit the human operator to create, store, and edit programs in the controller.

Figure 10:
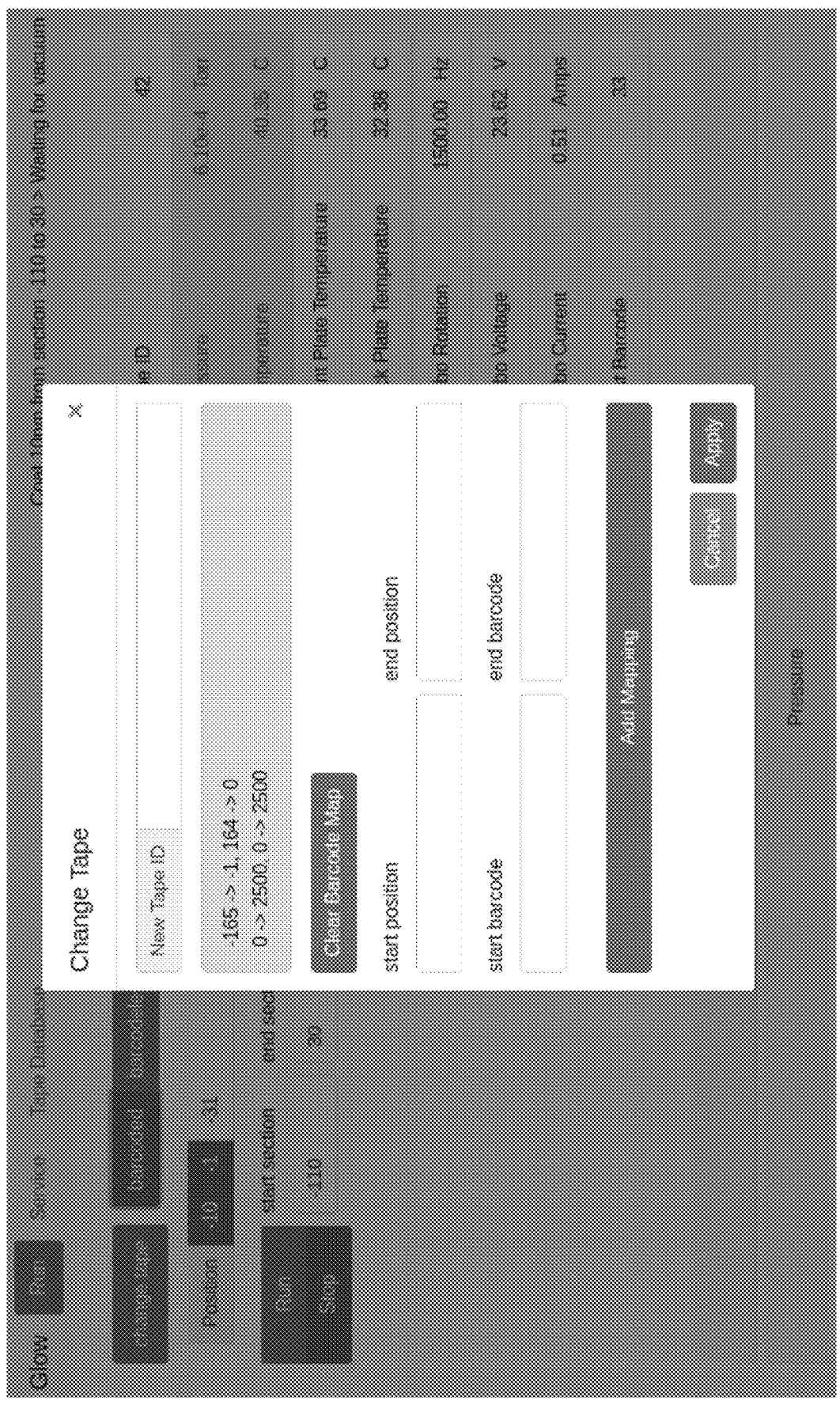
FIG. 10 is another partial screen capture of an example of an embodiment of a UI that is provided to a human operator.

FIG. 10 is another partial screen capture of an example of an embodiment of a UI that is presented to a human operator for control of coater 10. In this example, the UI permits the human operator to create and store a name for a particular reel (in this example, tape), or to retrieve such a name from a master database. The UI also permits a tape start position, tape end position, start barcode, and end barcode to be associated with the reel.

Coater 10 may have a one-touch control button 310, such as shown in the example of FIG. 2, to execute a preselected program that has been recorded in the controller. For example, one-touch control button 310 may execute a program that coats all of the samples in supply reel 190. In another example, the executed program may coat the samples differently, such as with different coating thicknesses, depending on how each sample is indexed or identified.

Although the foregoing embodiments have been described in detail by way of illustration and example for purposes of clarity of understanding, it will be readily apparent to those of ordinary skill in the art in light of the description herein that certain changes and modifications may be made thereto without departing from the spirit or scope of the appended claims. It is also to be understood that the terminology used herein is for the purpose of describing particular aspects only, and is not intended to be limiting, since the scope of the present invention will be limited only by the appended claims.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only," and the like in connection with the recitation of claim elements, or use of a "negative" limitation. As will be apparent to those of ordinary skill in the art upon reading this disclosure, each of the individual aspects described and illustrated herein has discrete components and features which may be readily separated from or combined with the features of any of the other several aspects without departing from the scope or spirit of the disclosure. Any recited method can be carried out in the order of events recited or in any other order which is logically possible. Accordingly, the preceding merely provides illustrative examples. It will be appreciated that those of ordinary skill in the art will be able to devise various arrangements which, although not explicitly described or shown herein, embody the principles of the disclosure and are included within its spirit and scope. For example, reels 110, 120 may be swapped between left and right and/or torques applied thereto switched from clockwise to counterclockwise or vice versa. Also, reels 190, 200 may be swapped between left and right and/or torques applied thereto switched from clockwise to counterclockwise or vice versa. Further, the locations of the tape drive and the filament drive described above may be swapped or rotated.

Furthermore, all examples and conditional language recited herein are principally intended to aid the reader in understanding the principles of the invention and the concepts contributed by the inventors to furthering the art, and are to be construed without limitation to such specifically recited examples and conditions. Moreover, all statements herein reciting principles and aspects of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary configurations shown and described herein.

In this specification, various preferred embodiments have been described with reference to the accompanying drawings. It will be apparent, however, that various other modifications and changes may be made thereto and additional embodiments may be implemented without departing from the broader scope of the claims that follow. The specification and drawings are accordingly to be regarded in an illustrative rather than restrictive sense.

I claim:

1. A coater for depositing a coating onto a sequence of discrete samples to be analyzed in a microscope, the coater comprising:
   a process chamber to maintain a low-pressure vacuum or controlled gaseous environment at a deposition region inside the process chamber;
   a sample conveyor to support and sequentially convey discrete samples through the deposition region;
   an evaporant supply, comprising an evaporant source, to vaporize a coating material from the evaporant source onto the samples at the deposition region;
   a power supply to provide power to the evaporant supply; and
   a controller to control one or more operations of the coater,
   wherein the sample conveyor is adapted to convey the discrete samples in a plurality of discrete movements in one direction and/or the controller is adapted to control the power supply to provide one or more discrete pulses of power to the evaporant supply, the frequency of the plurality of discrete movements or the one or more discrete pulses of power corresponding to a rate at which the discrete samples pass through the deposition region.

2. A coater according to claim 1, wherein the sample conveyor comprises a tape drive to control a position of a flexible tape that holds the discrete samples, the tape moving between a supply reel and a takeup reel.

3. A coater according to claim 1, wherein the evaporant source comprises a filament, the filament comprising the coating material to be deposited onto the discrete samples, and two or more heater electrodes to heat the filament to vaporize the coating material.

4. A coater according to claim 3, wherein the evaporant supply comprises a filament drive to control an advancement of the filament across the heater electrodes.

5. A coater according to claim 3, wherein the controller is adapted to control the power supply to apply one or more electrical potential differences across two or more of the heater electrodes to draw current through the filament.

6. A coater according to claim 3, wherein the coater comprises a preheating stage to pre-heat the filament and a main heating stage to vaporize the coating material from the filament.

7. A coater according to claim 3, wherein the filament comprises one or more of a carbon filament, carbon-fiber braid, and carbon ribbon.

8. A coater according to claim 3, wherein the heater electrodes are adapted to permit the filament to be wound around the heater electrodes in an "S"-shaped configuration.

9. A coater according to claim 1, further comprising a film-thickness monitor to detect a thickness of a coating that is deposited on a surface of a sample.

10. A coater according to claim 1, further comprising a camera to image the discrete samples.

11. A coater according to claim 1, further comprising a physical deposition shield to selectively block or allow deposition through an aperture between the evaporant supply and the sample.

12. A coater according to claim 1, further comprising a visually transparent window to allow a human operator to view the deposition process in real time.

13. A coater according to claim 1, further comprising a door to allow a human operator to physically access a process space inside the process chamber.

14. A coater according to claim 2, wherein the tape drive comprises one or more tension meters to measure the tension of the flexible tape.

15. A coater according to claim 1, wherein the sample conveyor is adapted to convey the discrete samples in discrete movements between fixed positions and the coater is adapted to provide the one or more discrete pulses of power to the evaporant supply at each of the fixed positions.

16. A coater according to claim 2, further comprising an identification code reader to read an identification code on the flexible tape.

17. A coater according to claim 16, wherein the identification code reader is adapted to read a plurality of identification codes on the flexible tape that identify respective instances of the discrete samples.

18. A coater according to claim 1, wherein the controller is adapted to control one or more of the components of the coater to deposit the coating in different predetermined thicknesses on different respective ones of the discrete samples.

19. A coater according to claim 1, wherein the sample conveyor is further adapted to convey the discrete samples in the opposite direction.

20. A coater according to claim 2, wherein the tape drive is adapted to move the flexible tape from the supply reel to the takeup reel, and also in the opposite direction.

* * * * *